(12) United States Patent
Noh et al.

(10) Patent No.: US 12,376,477 B2
(45) Date of Patent: Jul. 29, 2025

(54) DISPLAY APPARATUS

(71) Applicant: LG DISPLAY CO., LTD., Seoul (KR)

(72) Inventors: HyunJong Noh, Paju-si (KR); Suhyun Park, Paju-si (KR); Jinhyung Jung, Paju-si (KR); MinHyung Kim, Paju-si (KR)

(73) Assignee: LG Display Co., Ltd. (KR)

( * ) Notice: Subject to any disclaimer, the term of this patent is extended or adjusted under 35 U.S.C. 154(b) by 460 days.

(21) Appl. No.: 17/536,145

(22) Filed: Nov. 29, 2021

(65) Prior Publication Data

US 2022/0190058 A1 Jun. 16, 2022

(30) Foreign Application Priority Data

Dec. 10, 2020 (KR) .................. 10-2020-0172488

(51) Int. Cl.
| | |
|---|---|
| *H10K 59/80* | (2023.01) |
| *H10K 50/85* | (2023.01) |
| *H10K 59/12* | (2023.01) |
| *H10K 59/122* | (2023.01) |
| *H10K 59/35* | (2023.01) |

(52) U.S. Cl.
CPC ........... *H10K 59/875* (2023.02); *H10K 50/85* (2023.02); *H10K 59/12* (2023.02); *H10K 59/122* (2023.02); *H10K 59/353* (2023.02); *H10K 59/8791* (2023.02)

(58) Field of Classification Search
CPC .... H10K 59/353; H10K 50/85; H10K 59/122; H10K 59/12; H10K 59/8791; H10K 59/875; H10K 59/38; H10K 2102/3035; G02B 1/11; G02B 5/223
See application file for complete search history.

(56) References Cited

U.S. PATENT DOCUMENTS

| | | | |
|---|---|---|---|
| 10,437,096 B2 | 10/2019 | Byun et al. | |
| 11,068,089 B1* | 7/2021 | Kim | .................. G06V 40/1318 |
| 2018/0186109 A1* | 7/2018 | Byun | ............... B29D 11/00644 |
| 2019/0349550 A1* | 11/2019 | Bang | ...................... H04N 7/144 |
| 2020/0159284 A1* | 5/2020 | Mathew | ................ G06F 1/1605 |

FOREIGN PATENT DOCUMENTS

| | | |
|---|---|---|
| KR | 2018-0081197 A | 7/2018 |
| KR | 10-2020-0068970 A | 6/2020 |

OTHER PUBLICATIONS

Korean Office Action dated Oct. 17, 2024 issued in Patent Application No. 10-2020-0172488 (8 pages).

* cited by examiner

*Primary Examiner* — Syed I Gheyas
(74) *Attorney, Agent, or Firm* — Fish & Richardson P.C.

(57) ABSTRACT

A display apparatus includes a display panel including a plurality of pixel areas and an optical film disposed on a light output surface of the display panel. Each of the plurality of pixel areas includes an opening portion and a circuit portion surrounding the opening portion, the optical film includes a transmittance adjustment member, and the transmittance adjustment member includes a first portion overlapping with the circuit portion and a second portion overlapping with the opening portion.

19 Claims, 7 Drawing Sheets

DISPLAY APPARATUS

CROSS-REFERENCE TO RELATED APPLICATION

This application claims the benefit of the Korean Patent Application No. 10-2020-0172488 filed on Dec. 10, 2020 which is hereby incorporated by reference in its entirety.

BACKGROUND

Field of the Disclosure

The present disclosure relates to a display apparatus, and more particularly, to a display apparatus including an optical film to which a transmittance is selectively and differently applied.

Description of the Background

Display apparatuses have a fast response time and a low power consumption and do not have a problem in a viewing angle because of self-emitting light without a separate light source unlike liquid crystal display (LCD) apparatuses, and thus, are attracting much attention as next-generation flat display apparatuses.

Display apparatuses emit light by using a light emitting device including a light emitting layer disposed between two electrodes to display an image. In this case, light emitted from an electroluminescence device is discharged to the outside through an electrode and a substrate.

However, general display apparatuses use an optical film including a phase retarder and a polarizer so as to control the luminance and transmittance of a display panel, and the optical film is disposed on a front surface of the display panel to correspond to a circuit portion and an opening portion of a pixel in common. Due to this, a trade-off relationship between a luminance characteristic and a reflection characteristic of the display panel is not solved. As a result, a reflection characteristic is reduced for satisfying high luminance.

Therefore, general light emitting display apparatuses have a problem where luminance is reduced for light extraction efficiency, thus increasing power.

SUMMARY

Accordingly, the present disclosure is directed to providing a display apparatus that substantially obviates one or more problems due to limitations and disadvantages described above.

More specifically, the present disclosure is directed to providing a light emitting display apparatus for enhancing a light extraction efficiency of light emitted from a light emitting device.

The present disclosure is also directed to providing a light emitting display apparatus in which a light extraction efficiency of light emitted from a light emitting device is enhanced, and thus, a diffusion reflectance is reduced, thereby enhancing a visual characteristic of a black image.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a display panel including a plurality of pixel areas and an optical film disposed on a light output surface of the display panel, wherein each of the plurality of pixel areas includes an opening portion and a circuit portion surrounding the opening portion, the optical film includes a transmittance adjustment member, and the transmittance adjustment member includes a first portion overlapping with the circuit portion and a second portion overlapping with the opening portion.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principle of the disclosure.

In the drawings.

DETAILED DESCRIPTION

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings. In adding reference numerals to elements of each of the drawings, although the same elements are illustrated in other drawings, like reference numerals may refer to like elements.

Figure 1:
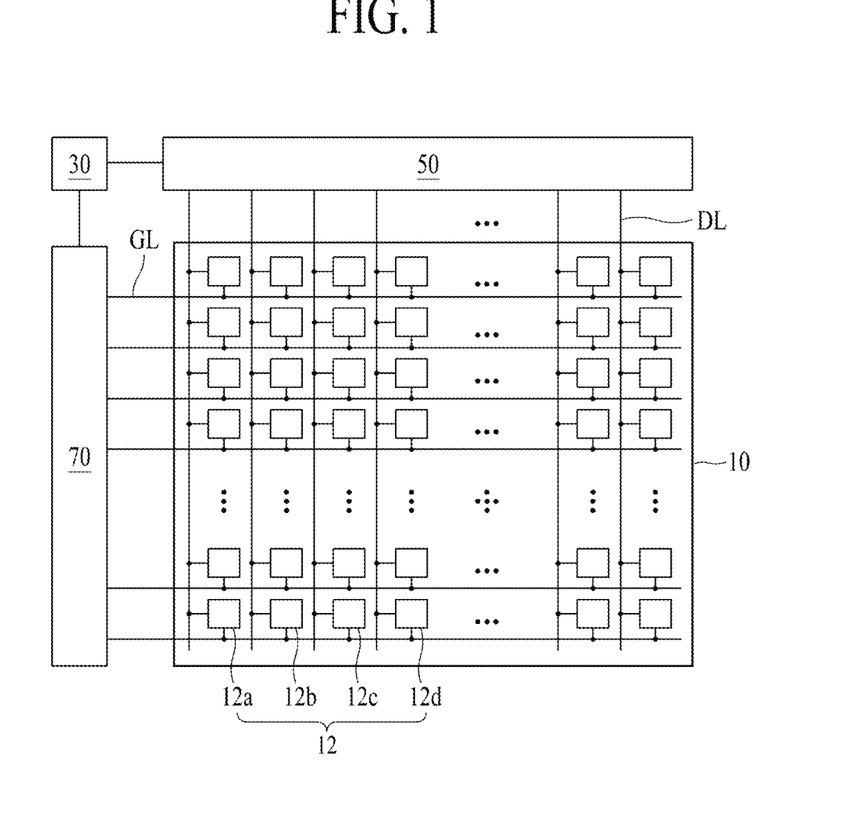
FIG. 1 is a diagram schematically illustrating a display apparatus according to the present disclosure.

FIG. 1 is a diagram schematically illustrating a light emitting display apparatus according to the present disclosure.

Referring to FIG. 1, the light emitting display apparatus according to the present disclosure may include a display panel 10, a control circuit 30, a data driving circuit 50, and a gate driving circuit 70.

The display panel 10 may include a plurality of gate lines GL provided on a substrate, a plurality of data lines DL provided on the substrate, and a plurality of pixels 12a to 12d respectively provided in a plurality of pixel areas defined by the plurality of gate lines GL and the plurality of data lines DL.

Each of the plurality of pixels 12a to 12d may display an image based on a gate signal supplied through an adjacent gate line GL and a data signal supplied through an adjacent data line DL. Each of the plurality of pixels 12a to 12d according to the present disclosure may include a pixel circuit provided in a pixel area and a light emitting device connected to the pixel circuit.

Each of the plurality of pixels 12a to 12d may be defined as a minimum unit area which actually emits light and may be referred to as a subpixel. Here, four pixels adjacent to one another may configure one unit pixel 12 for displaying a color.

The one unit pixel 12 according to the present disclosure may include four pixels 12a to 12d which are adjacent to one another in a lengthwise direction of the gate line GL. For example, the one unit pixel 12 may include first to fourth pixels 12a to 12d. In this case, the first pixel 12a may be a red pixel, the second pixel 12b may be a green pixel, the third pixel 12c may be a blue pixel, and the fourth pixel 12d may be a white pixel. The white pixel may be disposed between the blue pixel and the red pixel of the unit pixel 12 adjacent thereto, but is not limited thereto and may also be disposed between the red pixel and the green pixel in the unit pixel 12. Light emitting devices of the first to fourth pixels 12a to 12d according to an aspect may emit different color lights or white light.

According to another aspect, the one unit pixel 120 may be configured with the first to third pixels 12a to 12c, except the fourth pixel 12d which is a white pixel, of the first to fourth pixels 12a to 12d described above.

The control circuit 30 may generate pixel-based pixel data corresponding to each of the plurality of pixels 12a to 12d on the basis of video data input from the outside. The control circuit 30 may generate a data control signal on the basis of a timing synchronization signal and may provide the data control signal to the data driving circuit 50. The control circuit 30 may generate a gate control signal on the basis of the timing synchronization signal and may provide the gate control signal to the gate driving circuit 70.

The data driving circuit 50 may be connected to the plurality of data lines DL provided in the display panel 10. The data driving circuit 50 may receive the pixel-based pixel data and the data control signal provided from the control circuit 30 and may receive a plurality of reference gamma voltages provided from a power circuit. The data driving circuit 50 may convert the pixel-based pixel data into a pixel-based data signal (or a voltage) by using the data control signal and the plurality of reference gamma voltages and may supply the pixel-based data signal to a corresponding data line DL.

The gate driving circuit 70 may be connected to the plurality of gate lines GL provided in the display panel 10. The gate driving circuit 70 may generate a gate signal to supply the gate signal to a corresponding gate line GL in a predetermined order, on the basis of the gate control signal supplied from the control circuit 30.

The gate driving circuit 70 according to an aspect may be integrated at one edge or both edges of the display panel 10 through a process of manufacturing a thin film transistor (TFT) and may be connected to the plurality of gate lines in a one-to-one relationship. According to another aspect, the gate driving circuit 70 may be configured as an integrated circuit (IC) and may be mounted on the substrate or may be mounted on a flexible circuit film, and may be connected to the plurality of gate lines in a one-to-one relationship.

Figure 2:
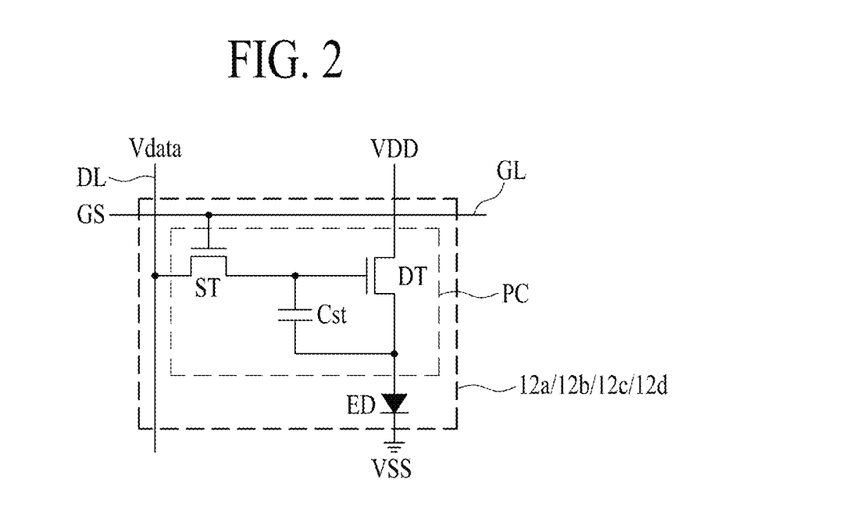
FIG. 2 is a circuit diagram illustrating a first pixel illustrated in FIG. 1.

FIG. 2 is a circuit diagram illustrating the first pixel 12a illustrated in FIG. 1.

Referring to FIG. 2, the first pixel 12a of the light emitting display apparatus according to the present disclosure may include a pixel circuit PC and an electroluminescence device ED.

The pixel circuit PC may be provided in a circuit portion in a pixel area defined by a gate line GL and a data line DL and may be connected to an adjacent gate line GL, an adjacent data line DL, and a first driving power source VDD. The pixel circuit PC may control the light emission of the electroluminescence device ED on the basis of a data signal Vdata from the data line DL, in response to a gate-on signal GS from the gate line GL. The pixel circuit PC according to an aspect may include a switching thin film transistor ST, a driving thin film transistor DT, and a capacitor Cst. However, a configuration of the pixel circuit PC of a display apparatus according to the present disclosure is not limited thereto.

The switching thin film transistor ST may include a gate electrode connected to the gate line GL, a first source/drain electrode connected to the data line DL, and a second source/drain electrode connected to a gate electrode of the driving thin film transistor DT. The switching thin film transistor ST may be turned on based on the gate-on signal GS supplied through the gate line GL and may supply the data signal Vdata, supplied through the data line DL, to the gate electrode of the driving thin film transistor DT.

The driving thin film transistor DT may include a gate electrode connected to the second source/drain electrode of the switching thin film transistor ST, a drain electrode connected to the first driving power source VDD, and a source electrode connected to the electroluminescence device ED. The driving thin film transistor DT may be turned on with a gate-source voltage thereof based on the data signal Vdata supplied from the switching thin film transistor ST and may control a current (or a data current) supplied from the first driving power source VDD to the electroluminescence device ED.

The capacitor Cst may be provided (or in an overlapping region) between the gate electrode and the source electrode of the driving thin film transistor DT, and thus, may store a voltage corresponding to the data signal Vdata supplied to the gate electrode of the driving thin film transistor DT and may turn on the driving thin film transistor DT with the stored voltage. At this time, the voltage stored in the capacitor Cst may be held until a new data signal Vdata of a next frame is supplied through the switching thin film transistor ST.

The electroluminescence device ED may be provided in an opening portion defined in the pixel area and may emit light with a current supplied from the pixel circuit PC.

The electroluminescence device ED according to an aspect may include a first electrode (or an anode electrode) connected to the pixel circuit PC and a second electrode (or a cathode electrode) connected to a second driving power source VSS. For example, the electroluminescence device ED may include an organic light emitting device, a quantum dot light emitting device, or an inorganic light emitting device, or may include a micro light emitting diode.

As described above, the first pixel 12a of the light emitting display apparatus according to an aspect of the present disclosure may display an image through the light emission of the electroluminescence device ED based on a current corresponding to the data signal Vdata. Likewise, each of the second to fourth pixels 12b to 12d may have the same configuration as that of the first pixel 12a, and thus, their repeated descriptions are omitted.

Figure 3:
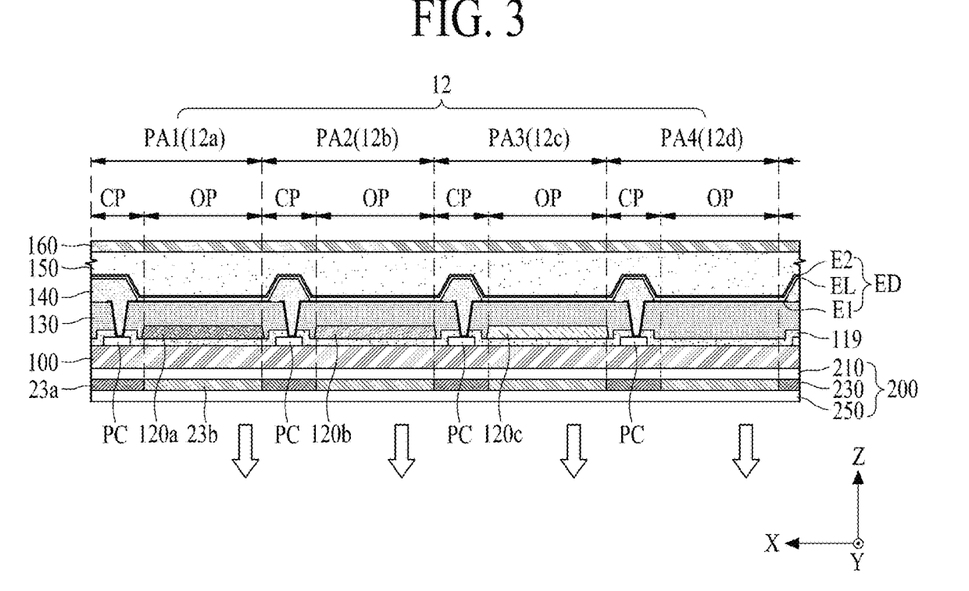
FIG. 3 is a cross-sectional view for describing a pixel including first to fourth pixels illustrated in FIG. 1.
Figure 4:
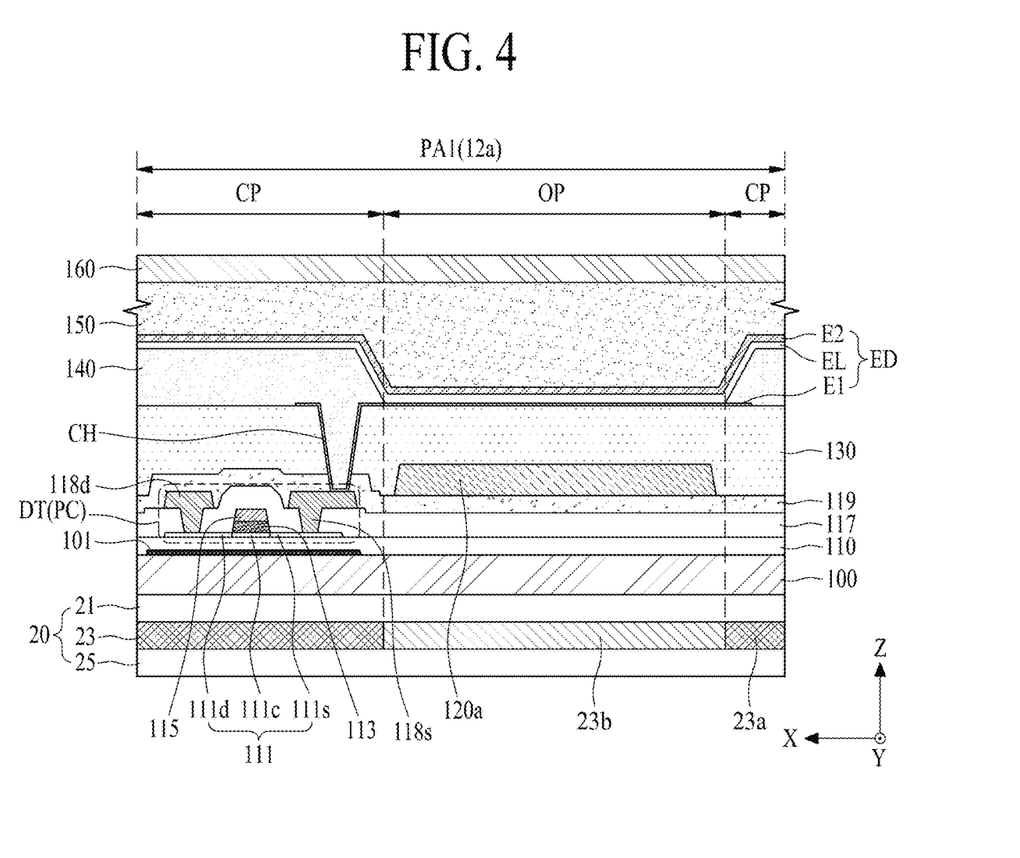
FIG. 4 is an enlarged view of a first pixel illustrated in FIG. 3.

FIG. 3 is a cross-sectional view for describing the display apparatus according to an aspect of the present disclosure illustrated in FIG. 1, and FIG. 4 is an enlarged view of a first pixel illustrated in FIG. 3. In FIGS. 3 and 4, a bottom emission structure is illustrated where light emitted from an electroluminescence device ED is irradiated toward a substrate 100, but an aspect of the present disclosure is not limited thereto. Accordingly, features described herein may be applied to the bottom emission structure where an optical film is disposed on a rear surface of a display panel or a top emission structure where an optical film is disposed on a front surface of a display panel.

Referring to FIGS. 3 and 4, a display panel 10 according to the present disclosure may include a substrate 100, a pixel circuit PC, a protection layer 119, an overcoat layer 130, an electroluminescence device ED, and an optical film 20.

The substrate 100 may include a glass material, but is not limited thereto and may include a transparent plastic material (for example, polyimide) that can be curved or bent. In a case where a plastic material is used as a material of the substrate 100, polyimide having an excellent heat resistance for enduring a high temperature may be used based on a case where a high temperature deposition process is performed on the substrate 100. A whole front surface of the substrate 100 may be covered by a buffer layer 110.

The buffer layer 110 can prevent a material included in the substrate 100 from being diffused to a transistor layer in a high temperature process of a process of manufacturing a thin film transistor. Also, the buffer layer 110 can prevent external water or humidity from penetrating into a light emitting device. The buffer layer 110 may include silicon oxide (SiOx) or silicon nitride (SiNx). Optionally, the buffer layer 110 may be omitted depending on the case.

The substrate 100 may include a plurality of pixel areas PA1 to PA4 which each include a circuit portion CP and an opening portion OP.

Four adjacent pixel areas of the plurality of pixel areas PA1 to PA4 may constitute a unit pixel area. For example, a unit pixel area may include first to fourth pixel areas PA1 to PA4. In this case, the first pixel area PA1 may be a red pixel area, the second pixel area PA1 may be a green pixel area, the third pixel area PA3 may be a blue pixel area, and the fourth pixel area PA4 may be a white pixel area.

The circuit portion CP may be defined as a transistor area defined in each of the plurality of pixel areas PA1 to PA4.

The opening portion OP may be defined as a light extraction area where light emitted from the electroluminescence device ED disposed in each of the plurality of pixel areas PA1 to PA4 is extracted (or discharged) to the outside.

The pixel circuit PC illustrated in FIG. 3 may denote a pixel circuit PC provided in the circuit portion CP of each of the plurality of pixel areas PA1 to PA4 and may include the driving thin film transistor DT, the switching thin film transistor ST, and the capacitor Cst of the pixel circuit PC illustrated in FIG. 2.

The driving thin film transistor DT according to an aspect may include an active layer 111, a gate insulation layer 113, a gate electrode 115, an interlayer insulation layer 117, a drain electrode 118d, and a source electrode 118s.

The active layer 111 may include a channel region 111c, a drain region 111d, and a source region 111s which are formed in a driving thin film transistor region of the circuit portion CP defined in the substrate 100 or the buffer layer 110. The active layer 111 may include the drain region 111d and the source region 111s, which have conductivity on the basis of an etching gas in an etching process performed on the gate insulation layer 113, and the channel region 111c which has no conductivity regardless of the etching gas. The drain region 111d and the source region 111s may be apart from each other in parallel with the channel region 111c therebetween.

The active layer 111 may include a semiconductor material including one of amorphous silicon, polycrystalline silicon, oxide, and an organic material, but is not limited thereto. For example, the active layer 111 according to the present disclosure may include oxide such as zinc oxide, tin oxide, Ga—In—Zn oxide, In—Zn oxide, and In—Sn oxide, or may include oxide doped with ions of aluminum (Al), nickel (Ni), copper (Cu), tantalum (Ta), molybdenum (Mo), zirconium (Zr), vanadium (V), hafnium (Hf), and titanium (Ti).

The gate insulation layer 113 may be formed on the channel 111c of the active layer 111. The gate insulation layer 113 may not be formed on a whole front surface of the buffer layer 110 or the substrate 100 including the active layer 111 and may be formed in an island shape on only the channel region 111c of the active layer 111.

The gate electrode 115 may be formed on the gate insulation layer 113 to overlap with the channel region 111c of the active layer 111. The gate electrode 115 may act as a mask so that the channel region 111c of the active layer 111 does not have conductivity based on an etching gas in a patterning process of patterning the gate insulation layer 113 through an etching process. The gate electrode 115 may include Mo, Al, chromium (Cr), gold (Au), titanium (Ti), Ni, neodymium (Nd), Cu, or an alloy thereof and may be formed of a single layer or a two or more-layer multilayer including metal or an alloy.

The interlayer insulation layer 117 may be formed on the gate electrode 115 and the drain region 111d and the source region 111s of the active layer 111. The interlayer insulation layer 117 may be formed on the whole front surface of the buffer layer 110 or the substrate 100 to cover the gate electrode 115 and the drain region 111d and the source region 111s of the active layer 111. The interlayer insulation layer 117 may include an inorganic material such as SiOx and SiNx.

The drain electrode 118d may be electrically connected to the drain region 111d of the active layer 111 through a first contact hole provided in the interlayer insulation layer 117 overlapping with the drain region 111d of the active layer 111.

The source electrode 118s may be electrically connected to the source region 111s of the active layer 111 through a second contact hole provided in the interlayer insulation layer 117 overlapping with the source region 111s of the active layer 111.

Each of the drain electrode 118d and the source electrode 118s may include the same metal material. For example, each of the drain electrode 118d and the source electrode 118s may include Mo, Al, Cr, Au, Ti, Ni, Nd, Cu, or an alloy thereof and may be formed of a single layer or a two or more-layer multilayer including metal or an alloy.

The switching thin film transistor ST may be provided on the circuit portion CP to have the same structure as that of the driving thin film transistor DT, and thus, its detailed description is omitted.

The capacitor Cst may be provided in an overlap with region between the gate electrode 115 and the source electrode 118s of the driving thin film transistor DT, which overlap with each other with the interlayer insulation layer 117 therebetween.

Additionally, a thin film transistor provided in the circuit portion CP may have a characteristic where a threshold voltage is shifted by light, but in order to prevent the shift of the threshold voltage, the light emitting display apparatus according to the present disclosure may further include a light blocking layer 101 provided under the active layer 111.

The light blocking layer 101 may be provided between the substrate 100 and the active layer 111 and may block light incident on the active layer 111 through the substrate 100, thereby minimizing or preventing the threshold voltage shift of a transistor caused by external light. The light blocking layer 101 may be covered by the buffer layer 110.

The protection layer 119 may be provided on the substrate 100 to cover a circuit layer. The protection layer 119 according to an aspect may be formed to cover the interlayer insulation layer and a drain electrode and a source electrode of each thin film transistor provided in the circuit portion CP. For example, the protection layer 119 may include an inorganic material such as SiOx and SiNx. Optionally, the protection layer 119 may be referred to as a passivation layer.

The overcoat layer 130 may be provided on the substrate 100 to cover the protection layer 119. The overcoat layer 130 according to an aspect may be formed to have a relatively thick thickness and may provide a flat surface on the substrate 100. For example, the overcoat layer 130 may include an organic material such as photo acryl, benzocyclobutene, polyimide, or fluorine resin. The overcoat layer 130 may be defined as a planarization layer.

The electroluminescence device ED may be disposed on the overcoat layer 130 to emit light on the basis of a data signal supplied through the driving thin film transistor DT of the pixel circuit PC and may irradiate the light toward the substrate 100 by using a bottom emission type.

The electroluminescence device ED according to an aspect may include a first electrode E1, an electroluminescence layer EL, and a second electrode E2.

The first electrode E1 may be formed on the overcoat layer 130 to overlap with an opening portion OP of each of the plurality of pixel areas PA1 to PA4 and to overlap with at least a portion of the circuit portion CP.

At least a portion of the first electrode E1 may be electrically connected to the source electrode 118s of the driving thin film transistor DT through the overcoat layer 130 and a contact hole CH provided in the overcoat layer 130 in the circuit portion CP.

The first electrode E1 may be an anode electrode of the electroluminescence device ED. The first electrode E1 according to an aspect may include a transparent conductive material such as transparent conductive oxide (TCO) so that light emitted from the electroluminescence device ED is irradiated toward the substrate 100. For example, the first electrode E1 may include indium tin oxide (ITO) or indium zinc oxide (IZO).

The electroluminescence device ED may be formed on the first electrode E1 and may directly contact the first electrode E1. The electroluminescence device ED according to an aspect may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The electroluminescence device ED according to an aspect may include one of a blue light emitting layer, a green light emitting layer, a red light emitting layer, and a white light emitting layer. For example, when a unit pixel includes the first to fourth pixels 12a to 12d, an electroluminescence layer EL disposed in the first pixel area PA1 may be a red light emitting layer, an electroluminescence layer EL disposed in the second pixel area PA2 may be a green light emitting layer, an electroluminescence layer EL disposed in the third pixel area PA3 may be a blue light emitting layer, and an electroluminescence layer EL disposed in the fourth pixel area PA4 may be a white light emitting layer. In this case, the electroluminescence layer EL of each of the first to fourth pixels 12a to 12d may be disposed on only the first electrode E1 overlapping with the opening portion OP of each of the pixel areas PA1 to PA4.

According to another aspect, the electroluminescence layer EL may include two or more light emitting units for emitting white light. For example, when a unit pixel includes the first to fourth pixels 12a to 12d, the electroluminescence device ED of each of the first to fourth pixels 12a to 12d may include a first light emitting unit and a second light emitting unit, for emitting white light on the basis of a combination of first light and second light. The first light emitting unit may emit the first light and may include one of a blue light emitting unit, a green light emitting unit, a red light emitting unit, a yellow light emitting unit, and a yellowish-green light emitting unit. The second light emitting unit may include one light emitting unit, except the first light emitting unit, of a blue light emitting unit, a green light emitting unit, a red light emitting unit, a yellow light emitting unit, and a yellowish-green light emitting unit. In this case, the electroluminescence layer EL may be a common layer of each of the first to fourth pixels 12a to 12d and may be disposed on only the first electrode E1 overlapping with the opening portion OP of each of the pixel areas PA1 to PA4, and moreover, may be disposed to overlap with the circuit portion CP of each of the pixel areas PA1 to PA4.

Therefore, the light emitting device of each of the first to fourth pixels 12a to 12d according to an aspect may emit the same white light. In this case, each of the first to fourth pixels 12a to 12d may include a plurality of wavelength conversion layers 120a to 120c which differ, and the wavelength conversion layers 120a to 120c may convert white light into different color lights. Also, the fourth pixel 12d may not include a wavelength conversion layer and may irradiate white light toward the substrate 100.

The second electrode E2 may be formed on the electroluminescence layer EL and may directly contact the electroluminescence layer EL. The second electrode E2 according to an aspect may be a cathode electrode of the electroluminescence layer EL. The second electrode E2 according to an aspect may include a metal material having a high reflectance so as to reflect light, which is emitted from the electroluminescence layer EL and is incident thereon, toward the substrate 100. For example, the second electrode E2 may be formed in a multi-layer structure such as a stack structure (Ti/Al/Ti) of Al and Ti, a stack structure (ITO/Al/ITO) of Al and ITO, an APC (Ag/Pd/Cu) alloy, or a stack structure (ITO/APC/ITO) of an APC alloy and ITO, or may include a single-layer structure including one material or an alloy of two or more materials selected from among silver (Ag), Al, Mo, Au, Mg, calcium (Ca), and barium (Ba).

The display panel 10 according to the present disclosure may further include a bank pattern 140 and an encapsulation layer 150.

The bank pattern 140 may define the opening portion OP of each of the pixel areas PA1 to PA4 and may be provided on an edge of the first electrode E1 and the overcoat layer 130. For example, the bank pattern 140 may include an organic material such as benzocyclobutene (BCB) resin, acryl resin, or polyimide resin. Alternatively, the bank pattern 140 may include a photosensitive material including a black pigment, and in this case, the bank pattern 140 may perform a function of a light blocking member which prevents the occurrence of color mixture between adjacent pixels 12a to 12d.

Each of the second electrode E2 and the electroluminescence layer EL of the light emitting device ED may also be formed over the bank pattern 140. That is, the electroluminescence layer EL may be formed to cove ran edge of the first electrode E1 and the bank pattern 140, and the second electrode E2 may be formed to cover the electroluminescence layer EL.

The encapsulation layer 150 may be formed on the substrate 100 to cover the second electrode E2 (i.e., a whole pixel). The encapsulation layer 150 may protect a thin film transistor and the electroluminescence device ED from an external impact and may prevent oxygen, water, and particles from penetrating into the electroluminescence device ED.

The encapsulation layer 150 according to an aspect may include at least one inorganic layer. Also, the encapsulation layer 150 may further include at least one organic layer. For example, the encapsulation layer 150 may include a first inorganic encapsulation layer, an organic encapsulation layer, and a second inorganic encapsulation layer. The first and second inorganic encapsulation layers may include one of an inorganic material of silicon oxide (SiOx), silicon nitride (SiNx), silicon oxynitride (SiON), titanium oxide (TiOx), and aluminum oxide (AlOx). Also, the organic encapsulation layer may include one organic material of acryl resin, epoxy resin, phenolic resin, polyamide resin, polyimide resin, and benzocyclobutene resin. The organic encapsulation layer may be referred to as a particle cover layer.

Optionally, the encapsulation layer 150 may be changed to a filler surrounding a whole pixel, and in this case, the display panel 10 according to the present disclosure may further include an encapsulation substrate 160 which is attached on the substrate 100 by using the filler. The encapsulation substrate 160 may include a plastic material, a glass material, or a metal material. The filler may include a getter material which absorbs oxygen or/and water.

Additionally, in a case where the electroluminescence device ED according to an aspect of the present disclosure emits white light, the display panel 10 according to the present disclosure may further include the wavelength conversion layers 120a to 120c which are disposed to respectively overlap with the opening portions OP of the first to third pixel areas PA1 to PA3 of the pixel areas PA1 to PA4.

The wavelength conversion layers 120a to 120c may be provided between the substrate 100 and the overcoat layer 130 to overlap with the opening portions OP. For example, the wavelength conversion layers 120a to 120c may be provided between the protection layer 119 and the overcoat layer 130 to overlap with the opening portions OP. As another example, the wavelength conversion layers 120a to 120c may be provided between the interlayer insulation layer 117 and the protection layer 119 to overlap with the opening portions OP, or may be provided between the substrate 100 (or the buffer layer 110) and the interlayer insulation layer 117 to overlap with the opening portions OP.

The wavelength conversion layers 120a to 120c according to an aspect may include a color filter which transmits only a wavelength of a color, set in a pixel, of light emitted from the electroluminescence device ED of a corresponding pixel of the pixels 12a to 12c to the substrate 100. For example, the wavelength conversion layers 120a to 120c may include a red color filter 120a overlapping with an opening portion OP of the first pixel area PA1, a green color filter 120b overlapping with an opening portion OP of the second pixel area PA2, and a blue color filter 120c overlapping with an opening portion OP of the third pixel area PA3.

According to another aspect, the wavelength conversion layers 120a to 120c may each include a quantum dot having a size, which re-emits light on the basis of light emitted from the electroluminescence device ED to the substrate 100 to emit light having a color set in a pixel. The quantum dot according to an aspect may include one of CdS, CdSe, CdTe, CdZnSeS, ZnS, ZnSe, GaAs, GaP, GaAs—P, Ga—Sb, InAs, InP, InSb, AlAs, AlP, and AlSb. For example, the wavelength conversion layers 120a to 120c may include a red quantum dot pattern 120a overlapping with the opening portion OP of the first pixel area PA1, a green quantum dot pattern 120b overlapping with the opening portion OP of the second pixel area PA2, and a blue quantum dot pattern 120c overlapping with the opening portion OP of the third pixel area PA3. For example, the red quantum dot pattern 120a may include CdSe or InP, the green quantum dot pattern 120b may include a quantum dot including CdZnSeS, and the blue quantum dot pattern 120c may include a quantum dot including ZnSe. As described above, a light emitting display apparatus where each of the wavelength conversion layers 120a to 120c include a quantum dot may have a high color reproduction rate.

According to another aspect, the wavelength conversion layers 120a to 120c may include a red color filter 120a including a red quantum dot, a green color filter 120b including a green quantum dot, and a blue color filter 120c including a blue quantum dot. In this case, the red color filter 120a may not include the red quantum dot so that a transmittance of light having a long wavelength range is reduced.

Moreover, in a case where a display apparatus according to another aspect of the present disclosure has the top emission structure, a wavelength conversion layer may be provided on the electroluminescence device ED.

The optical film 20 may be provided on the display panel 10 and may be disposed at a light output surface. In detail, the optical film 20 may be attached on a rear surface (or a second surface) opposite to a front surface (or a first surface) of the substrate 100.

The optical film 20 according to the present disclosure may include a transmittance adjustment member 23 and a reflection reducing member 25, and moreover, may further include an adhesive member 21 attached on a rear surface of the substrate 100.

The transmittance adjustment member 23 may include a first portion 23a having a low transmittance and a second portion 23b having a transmittance which is higher than that of the first portion 23a. In this case, the first portion 23a of the transmittance adjustment member 23 may overlap with the circuit portion CP, and the second portion 23b of the transmittance adjustment member 23 may overlap with the opening portion OP.

Here, a low transmittance of the first portion 23a of the transmittance adjustment member 23 may denote that the first portion 23a has a transmittance of 20% or less with respect to a visible light wavelength recognizable by a user. Therefore, the first portion 23a of the transmittance adjustment member 23 may have a low transmittance with respect to a visible light wavelength incident from the outside and may lower a reflectance of a material (for example, metal) which is high reflectance and is disposed in a region corresponding to the circuit portion CP of the first portion 23a of the transmittance adjustment member 23.

A transmittance of the second portion 23b of the transmittance adjustment member 23 may have a transmittance of 80% or more with respect to visible light without all range. Therefore, when light emitted from the electroluminescence device ED is extracted from a lower substrate, the second portion 23b of the transmittance adjustment member 23 may have a high transmittance, and thus, emission efficiency and luminescence may be enhanced. Accordingly, as the transmittance adjustment member 23 having a structure described above is applied to the display apparatus according to the present disclosure, the luminance of the display panel 10 including the electroluminescence device ED may be enhanced and a reflection characteristic may also be satisfied, and thus, power consumption may be reduced.

The transmittance adjustment member 23 may include a first material configuring a matrix and a second material including a dye or a pigment dispersed to the first material.

A first material configuring the matrix of the transmittance adjustment member 23 may be a transparent material and may include at least one of pressure sensitive adhesive (PSA), polymethylmethacrylate (PMMA), poly carbonate (PC), and; poly vinyl alcohol (PVA), but is not limited thereto. According to an aspect, the first material configuring the matrix of the transmittance adjustment member 23 may include a material having a high transmittance of 80% or more with respect to visible light.

The second material dispersed to the first material of the transmittance adjustment member 23 may include a dye or a pigment having a low transmittance with respect to wavelength ranges of red, green, and blue light sources selected from a wavelength range of a visible light range. Here, the wavelength ranges of the red, green, and blue light sources may denote wavelengths where center wavelengths are about 420 nm, 550 nm, and 700 nm, respectively.

Therefore, the second material of the transmittance adjustment member 23 may include a dye or a pigment having a low transmittance with respect to the wavelength ranges of the red, green, and blue light sources selected from the wavelength range of the visible light range, and thus, in a case where wavelengths of 390 nm to 450 nm, 520 nm to 580 nm, and 670 nm to 730 nm pass through the transmittance adjustment member 23, the second material may have a transmittance of about 40% or less.

However, in a case where the second material which absorbs light sources having red, green, and blue wavelengths is disposed in a region corresponding to the opening portion OP, the second material may absorb a wavelength of light sources emitted from the electroluminescence device ED, and thus, emission efficiency may be reduced. Accordingly, the second portion 23b, corresponding to the opening portion OP, of the transmittance adjustment member 23 according to an aspect of the present disclosure may decompose a dye or a pigment, which selectively absorbs red, green, and blue wavelengths, through laser treatment, and thus, the second portion 23b of the transmittance adjustment member 23 may be provided to have a high transmittance.

According to another aspect of the present disclosure, the first material of the transmittance adjustment member 23 may be provided as a transparent material, and the second material may be provided as a type where the second material is coated on a surface of the first material.

Here, a laser treatment method of decomposing a dye or a pigment included in the transmittance adjustment member 23 may be performed by using a process of irradiating a laser, having a selected wavelength, onto a region overlapping with the opening portion OP.

The reflection reducing member 25 may lower a reflectance of external light and may prevent the visibility of a user from being reduced by the reflection of the external light. For example, the reflection reducing member 25 may be provided as a type where a low reflection coating layer is coated on a transparent base material. Additionally, the reflection reducing member 25 may be provided as one body with a rear surface of the transmittance adjustment member 23. That is, the reflection reducing member 25 may be embedded into the transmittance adjustment member 23, and in this case, the reflection reducing member 25 may be defined as an optical film having a low reflection characteristic with respect to the external light.

Alternatively, the reflection reducing member 25 may be formed by dispersing a low reflection material, needed for low reflection, to the transparent base material. For example, the low reflection material may include one of titanium nitride (TiNx), titanium oxynitride (TiOxNy), carbon black, carbon nanotube, and amorphous carbon.

The adhesive member 21 may be disposed between the transmittance adjustment member 23 and the substrate 100 and may include an optically clear adhesive (OCA).

Figure 5A:
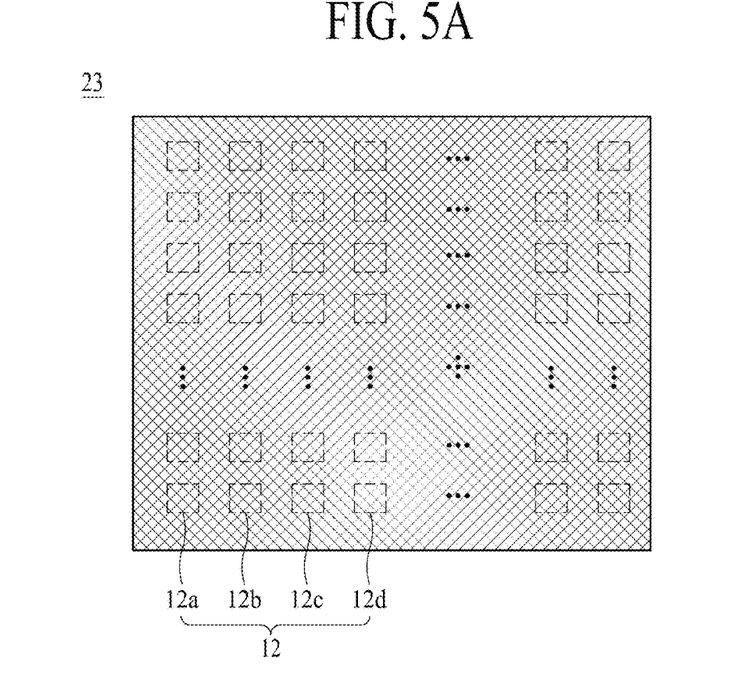
FIG. 5A illustrates a plan view before laser treatment is performed on an optical film according to the present disclosure.
Figure 5B:
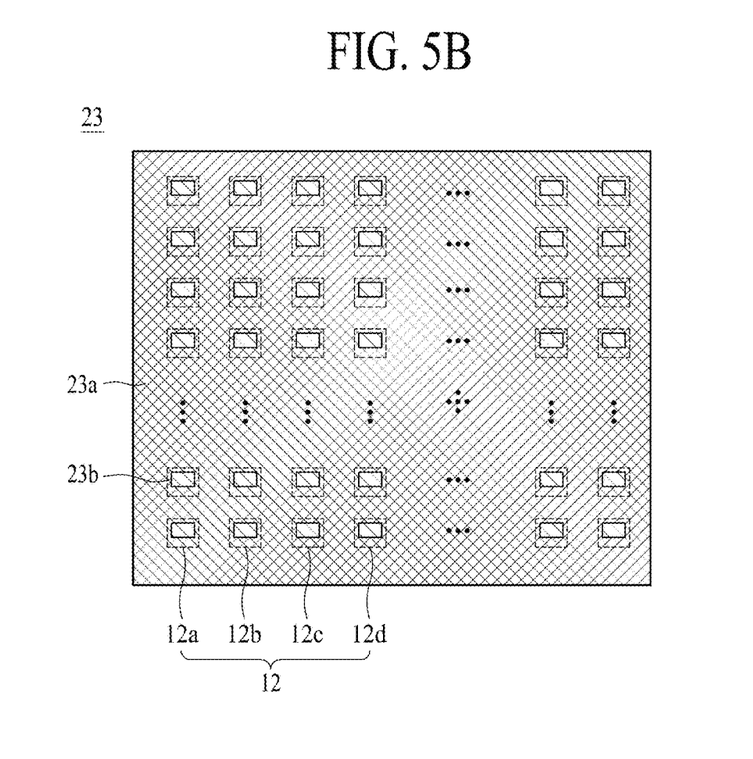
FIGS. 5B and 5C illustrate plan views after laser treatment is performed on the optical film according to the present disclosure.
Figure 5C:
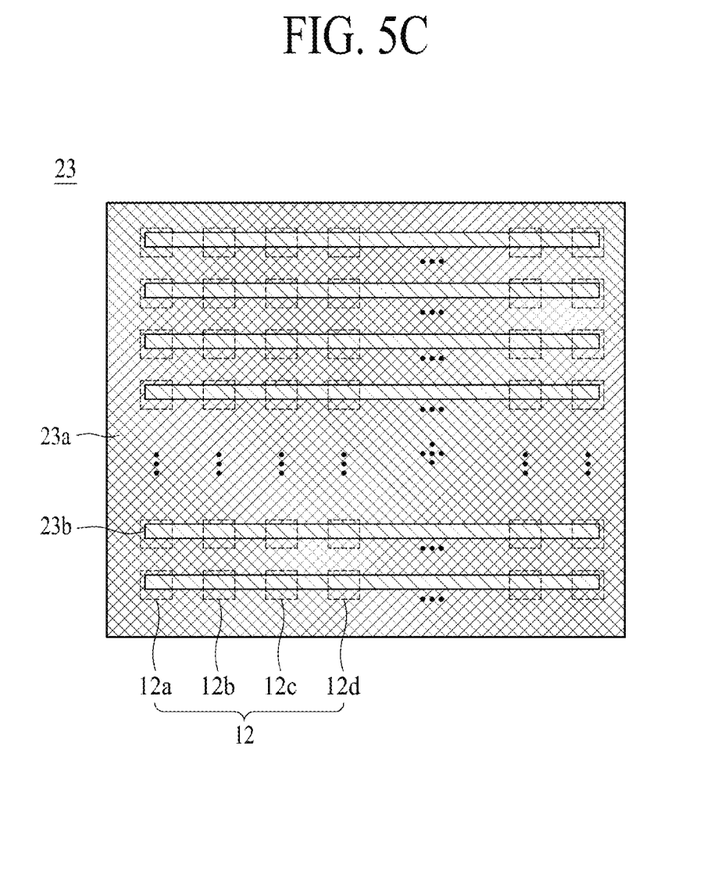

FIG. 5A illustrates a plan view before laser treatment is performed on an optical film according to the present disclosure, and FIGS. 5B and 5C illustrate plan views after laser treatment is performed on the optical film according to the present disclosure.

In FIGS. 5A to 5C, only a transmittance adjustment member 23 is illustrated for convenience of description, but the present aspect is not limited thereto. For example, in performing laser treatment on a region corresponding to the second portion 23b of the transmittance adjustment member 23, the optical film 20 where the transmittance adjustment member 23 is bonded to the reflection reducing member 25 described below with reference to FIG. 6 may be used, or the first portion 23a and the second portion 23b of the transmittance adjustment member 23 may be divisionally formed through laser treatment in a state where the transmittance adjustment member 23 is stacked on the display panel 10.

Therefore, according to an aspect of the present disclosure, the second portion 23b of the transmittance adjustment member 23 may be formed to correspond to each of a plurality of pixels 12a to 12d in a one-to-one relationship.

Referring to FIGS. 5A and 5B, the second portion 23b of the transmittance adjustment member 23 may be formed in a region corresponding to each of opening portions OP of the plurality of pixels 12a to 12d. In this case, the second portion 23b of the transmittance adjustment member 23 may be formed by irradiating a laser having a wavelength selected from a visible light wavelength. As described above, the transmittance adjustment member 23 may include a dye or a pigment having a low transmittance or a high absorptance with respect to a specific wavelength of visible light, and the dye or the pigment may be decomposed by irradiating a laser having a corresponding wavelength.

Referring to FIG. 5C, the second portion 23b of the transmittance adjustment member 23 may be formed as a stripe type where the second portion 23b crosses the opening portions OP of the plurality of pixels 12a to 12d in one direction. The second portion 23b of the transmittance adjustment member 23 having the stripe type illustrated in FIG. 5C may be formed so that the plurality of pixels 12a to 12d are adjacent to one another and may be applied to a case where an area of the circuit portion CP between the plurality of pixels 12a to 12d is not large.

Therefore, according to another aspect of the present disclosure, the second portion 23b of the transmittance adjustment member 23 may be formed to correspond to the plurality of pixels 12a to 12d.

Figure 6:
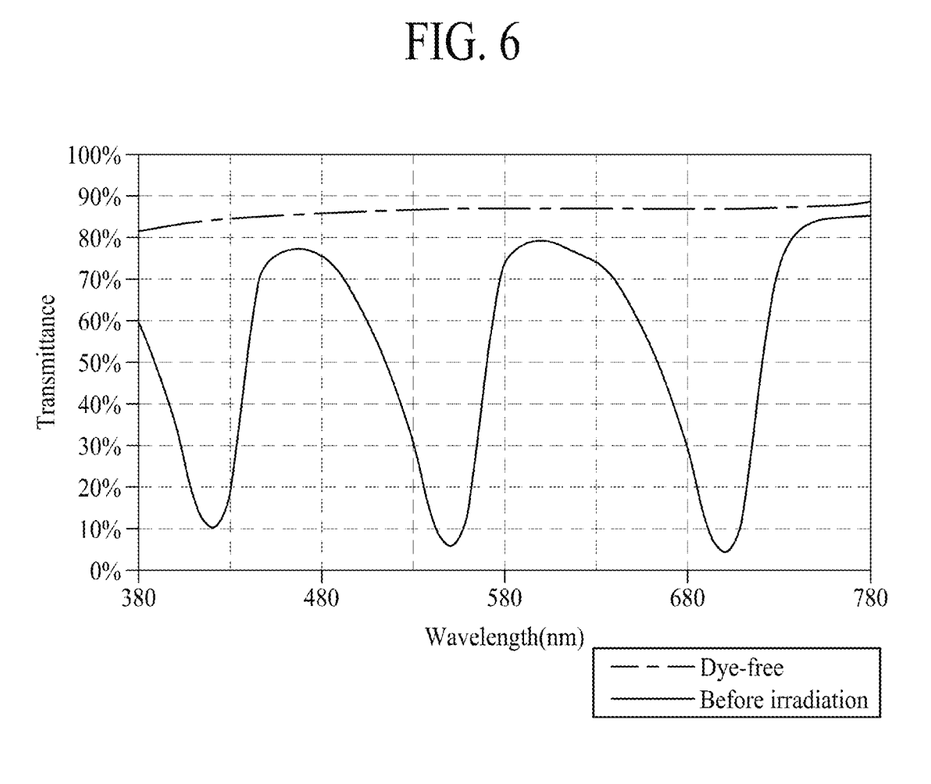
FIG. 6 is a graph showing a transmittance of visible light of the optical film according to the present disclosure.

FIG. 6 is a graph showing a transmittance of visible light of an optical film according to the present disclosure. In FIG. 6, a solid represents a transmittance of the first portion 23a of the transmittance adjustment member 23 with respect to visible light or before a laser is irradiated onto the optical film 20, and a dotted line represents a transmittance when the transmittance adjustment member 23 does not include a dye or a pigment and include only the first material.

Referring to FIG. 6, it may be seen that the first portion 23a of the transmittance adjustment member 23 according to the present disclosure has three dips representing a low transmittance in a wavelength range of 380 nm to 780 nm which is a visible light range. Here, a dip may denote a transmittance which is lower than a transmittance corresponding to another wavelength where a dip is not observed, and for example, may denote a region representing a transmittance of 40% or less.

The transmittance adjustment member 23 according to the present disclosure may be provided to have three dips before laser irradiation, center wavelengths of the three dips may be about 420 nm, 550 nm, and 700 nm, and the transmittance adjustment member 23 may have a low transmittance of about 20% or less within a certain range including the center wavelength of each of the dips. In other words, the transmittance adjustment member 23 according to the present disclosure may have a maximum absorptance with respect to light sources having wavelengths of about 420 nm, 550 nm, and 700 nm.

Therefore, the optical film 20 including the transmittance adjustment member 23 according to the present disclosure may include a dye or a pigment having a high absorptance with respect to red, green, and blue wavelengths, and thus, when a user observes the optical film 20 with eyes, the optical film 20 may be observed as a colored film with respect to a light source having a visible light wavelength. Here, "colored" may denote a color where brightness is dark, and for example, may be black.

Figure 7:
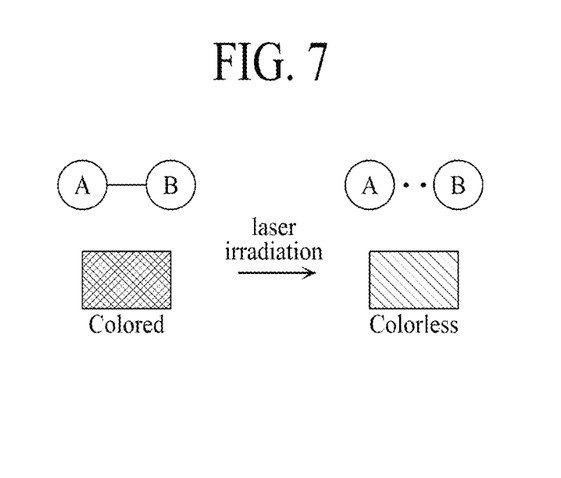
FIG. 7 schematically illustrates an example where a chemical structure of a material included in a transmittance adjustment member according to the present disclosure is decomposed by laser treatment and a colored material is changed to a colorless material.

FIG. 7 schematically illustrates an example where a chemical structure of a material included in a transmittance adjustment member according to the present disclosure is decomposed by laser treatment and a colored material is changed to a colorless material.

As described above, the optical film 20 including the transmittance adjustment member 23 according to the present disclosure may include a dye or a pigment having a high absorptance with respect to red, green, and blue wavelengths, and thus, when a user observes the optical film 20 with eyes, the optical film 20 may be observed as a colored film with respect to a light source having a visible light wavelength. Here, "colored" may denote a color where brightness is dark, and for example, may be black. A colored characteristic of the optical film 20 or the transmittance adjustment member 23 may be based on the dye or the pigment included in the transmittance adjustment member 23.

Referring to FIG. 7, in a dye or a pigment formed in a combination structure of an A material and a B material, after a laser is irradiated, a bonding between the A material and the B material may be broken, a colored characteristic of the dye or the pigment may be removed, and the dye or the pigment may be transparent.

Figure 8A:
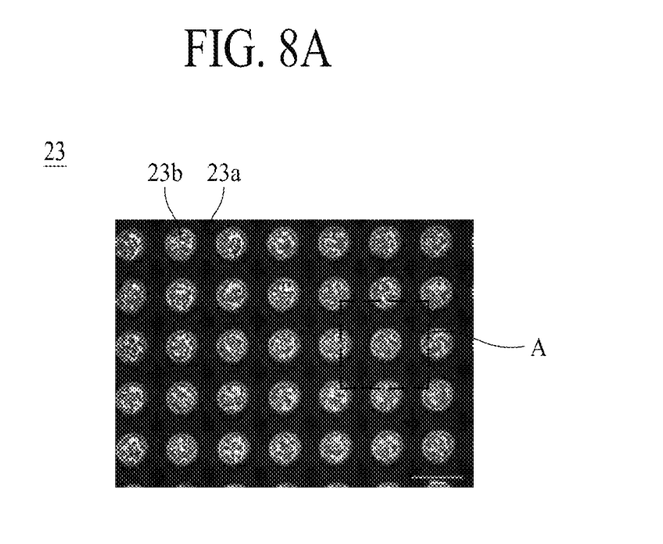
FIG. 8A shows an optical photograph captured after laser treatment is performed on the optical film according to the present disclosure.
Figure 8B:
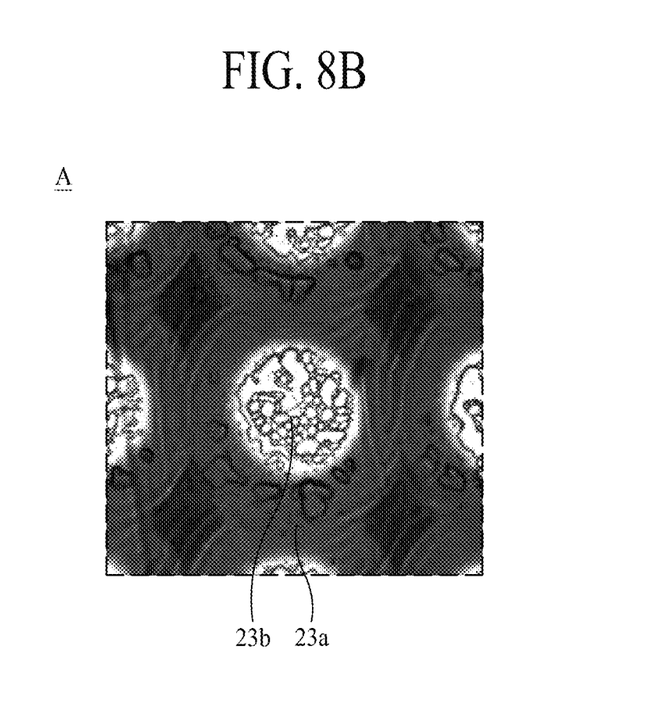
FIG. 8B illustrates an enlarged view of region A in FIG. 8A.

FIG. 8A shows an optical photograph captured after laser treatment is performed on an optical film according to the present disclosure, and FIG. 8B illustrates an enlarged view of a region A illustrated in FIG. 8A. In FIG. 8, a nano green laser having a wavelength of 532 nm has been used for forming the first portion 23a and the second portion 23b of the transmittance adjustment member 23, and the nano green laser has been selectively irradiated onto the second portion 23b of the transmittance adjustment member 23.

Referring to FIGS. 8A and 8B, the transmittance adjustment member 23 may be changed from a colored transmittance adjustment member 23 to a colorless or transparent transmittance adjustment member 23 by irradiating a laser having a certain selected wavelength of wavelengths of visible lights including red, green, and blue. In this case, the colorless or transparent transmittance adjustment member 23 may correspond to the second portion 23b of the transmittance adjustment member 23 described above.

Moreover, the transmittance adjustment member 23 according to another aspect of the present disclosure may be changed from a colored transmittance adjustment member 23 to a colorless or transparent transmittance adjustment member 23 by irradiating ultraviolet (UV). In this case, the colorless or transparent transmittance adjustment member 23 may correspond to the second portion 23b of the transmittance adjustment member 23 described above. In a case where the first portion 23a and the second portion 23b of the transmittance adjustment member 23 are formed through UV treatment, a dye or a pigment of the first material used herein may be a material which is easily decomposed and uncolored by UV.

Figure 9:
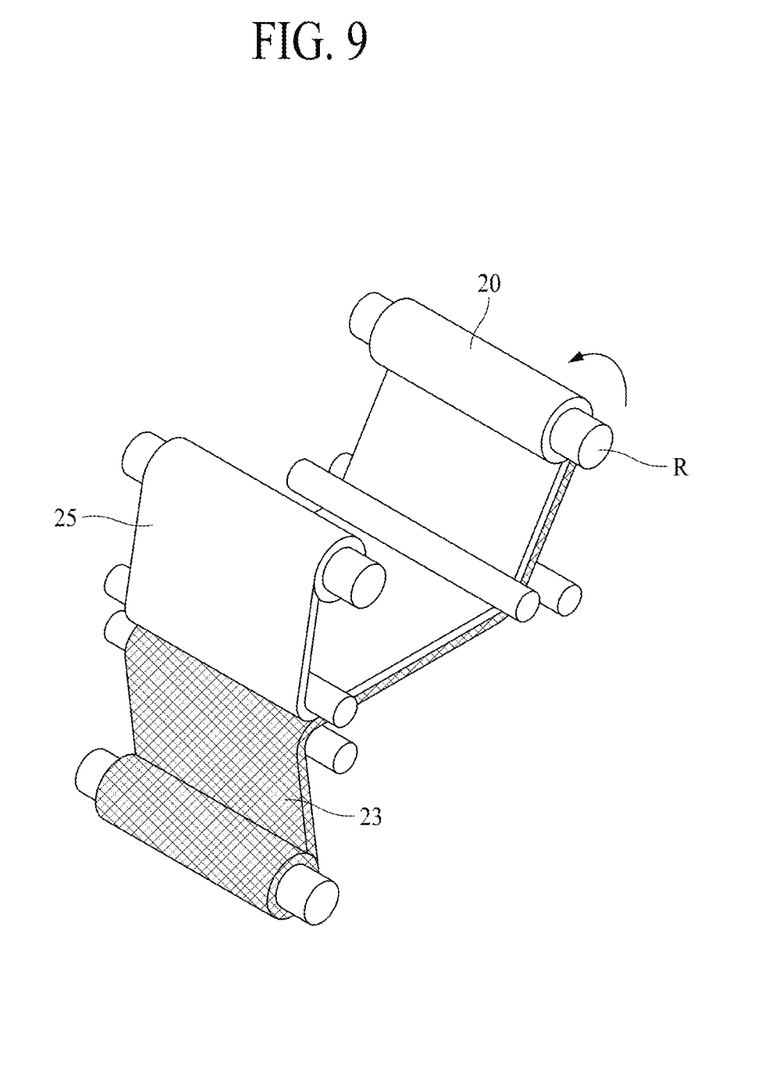
FIG. 9 is a schematic diagram of a method of manufacturing an optical film according to the present disclosure.

FIG. 9 is a schematic diagram of a method of manufacturing an optical film 20 according to the present disclosure.

Referring to FIG. 9, the optical film 20 according to the present disclosure may be provided by a process of bonding a transmittance adjustment member 23 to a reflection reducing member 25, and for example, a bonding process may be performed by using a plurality of rolls R. Comparing with an optical film including a polarizing film of the related art, in the optical film 20 according to the present disclosure, an elongation process performed in one direction for a polarizing film characteristic may be removed, and thus, a method of manufacturing an optical film according to the present disclosure may have an enhanced productivity.

In FIG. 9, in the optical film 20 where the transmittance adjustment member 23 is bonded to the reflection reducing member 25, a laser irradiation process may be performed subsequently, and after a laser irradiation process is performed, a first portion 23a and a second portion 23b of the transmittance adjustment member 23 may be divisionally formed.

A display apparatus according to the present disclosure will be described below.

A display apparatus according to an aspect of the present disclosure includes a display panel including a plurality of pixel areas; and an optical film disposed on a light output surface of the display panel, wherein each of the plurality of pixel areas includes an opening portion and a circuit portion surrounding the opening portion, the optical film includes a transmittance adjustment member, and the transmittance adjustment member includes a first portion overlapping with the circuit portion and a second portion overlapping with the opening portion.

According to an aspect of the present disclosure, a transmittance of the first portion of the transmittance adjustment member is 20% or less.

According to an aspect of the present disclosure, a transmittance of the second portion of the transmittance adjustment member is 80% or more.

According to an aspect of the present disclosure, the transmittance adjustment member includes: a first material including a matrix; and a second material dispersed to the first material, the first material includes a transparent polymer material, and the second material includes a dye or a pigment having a transmittance of 40% or less with respect to each of a red wavelength, a green wavelength, and a blue wavelength.

According to an aspect of the present disclosure, the red wavelength is within a range of 600 nm to 730 nm, the green wavelength is within a range of 500 nm to 600 nm, and the blue wavelength is within a range of 400 nm to 500 nm.

According to an aspect of the present disclosure, the second material is decomposed and uncolored by laser treatment using a laser having a selected wavelength from group consisting of between 390 nm to 450 nm, between 520 nm to 580 nm, and between 670 nm to 730 nm.

According to an aspect of the present disclosure, the second material is decomposed and uncolored by ultraviolet treatment.

According to an aspect of the present disclosure, the optical film further includes a reflection reducing member disposed on the transmittance adjustment member, and the reflection reducing member is disposed more outward from the display panel than the transmittance adjustment member.

According to an aspect of the present disclosure, the second portion of the transmittance adjustment member is provided in each of the opening portions of the plurality of pixel areas.

According to an aspect of the present disclosure, the second portion of the transmittance adjustment member is provided in a stripe structure to correspond to the opening portions of the plurality of pixel areas.

According to an aspect of the present disclosure, the display panel includes: a substrate; a pixel circuit provided in the substrate; a planarization layer covering the pixel circuit; an electroluminescence device provided on the planarization layer, the electroluminescence device including a first electrode; and a bank pattern overlapping with at least a portion of the first electrode, the opening portion overlap with a region where the bank pattern is not provided, and the pixel circuit overlap with at least a portion of the circuit portion.

A display apparatus according to an aspect of the present disclosure includes: a substrate including a plurality of pixel areas each including an opening portion and a circuit portion surrounding the opening portion; a pixel circuit provided on the substrate; a planarization layer covering the pixel circuit; an electroluminescence device provided on the planarization layer, the electroluminescence device including a first electrode; a bank pattern overlapping with at least a portion of the first electrode; and an optical film disposed under the substrate, wherein the optical film includes a transmittance adjustment member, and the opening portion overlap with a region where the bank pattern is not provided, and the transmittance adjustment member includes a first portion overlapping with the circuit portion and a second portion overlapping with the opening portion.

According to the present disclosure, an emission efficiency of light emitted from a light emitting device may be enhanced, and a reflectance of a circuit portion with a pixel circuit provided therein may be lowered.

According to the present disclosure, by using optical films having different transmittances in an opening portion and a circuit portion of a display panel, the luminance of an electroluminescence device may be enhanced, and a reflection characteristic corresponding to external light may be satisfied.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a display panel including a plurality of pixel areas; and
an optical film disposed on a light output surface of the display panel,
wherein each of the plurality of pixel areas includes an opening portion and a circuit portion surrounding the opening portion,
wherein the opening portion includes an electroluminescence device emitting light,
wherein the optical film includes a transmittance adjustment member having a first material as a matrix and a second material different from the first material dispersed in the first material, and a reflection reducing member being in direct contact with the first material and the second material of the transmittance adjustment member, and
wherein the transmittance adjustment member has a first portion overlapping with the circuit portion and a second portion overlapping with the opening portion.

2. The display apparatus of claim 1, wherein a transmittance of the first portion of the transmittance adjustment member is 20% or less.

3. The display apparatus of claim 1, wherein a transmittance of the second portion of the transmittance adjustment member is 80% or more.

4. The display apparatus of claim 1, wherein the first material comprises a transparent polymer material, and wherein the second material comprises a dye or a pigment having a transmittance of 40% or less with respect to each of a red wavelength, a green wavelength, and a blue wavelength.

5. The display apparatus of claim 4, wherein the red wavelength is within a range of 600 nm to 730 nm,
the green wavelength is within a range of 500 nm to 600 nm, and
the blue wavelength is within a range of 400 nm to 500 nm.

6. The display apparatus of claim 5, wherein the second material is decomposed and uncolored by laser treatment using a laser having a wavelength between 390 nm to 450 nm, between 520 nm to 580 nm and between 670 nm to 730 nm.

7. The display apparatus of claim 5, wherein the second material is decomposed and uncolored by an ultraviolet treatment.

8. The display apparatus of claim 1,
wherein the reflection reducing member is disposed more outward from the display panel than the transmittance adjustment member.

9. The display apparatus of claim 1, wherein the second portion of the transmittance adjustment member is provided in each of the opening portions of the plurality of pixel areas.

10. The display apparatus of claim 1, wherein the second portion of the transmittance adjustment member is provided in a stripe structure to correspond to the opening portions of the plurality of pixel areas.

11. The display apparatus of claim 1, wherein the display panel comprises:
a substrate;
a pixel circuit provided in the substrate;
a planarization layer covering the pixel circuit;
the electroluminescence device provided on the planarization layer, the electroluminescence device including a first electrode;
a bank pattern overlapping with at least a portion of the first electrode; and
a wavelength conversion layer overlapping with the opening portion and being disposed between the electroluminescence device and the optical film,
wherein the opening portion overlap with a region where the bank pattern is not provided, and
wherein the pixel circuit overlap with at least a portion of the circuit portion an optical film disposed under the substrate.

12. A display apparatus comprising:
a substrate including a plurality of pixel areas each including an opening portion and a circuit portion surrounding the opening portion;
a pixel circuit provided on the substrate;
a planarization layer covering the pixel circuit;
an electroluminescence device provided on the planarization layer, the electroluminescence device including a first electrode;
a bank pattern overlapping with at least a portion of the first electrode; and
an optical film disposed under the substrate,
wherein the optical film comprises a transmittance adjustment member having a first material as a matrix and a second material different from the first material dispersed in the first material, and a reflection reducing member being in direct contact with the first material and the second material of the transmittance adjustment member, the opening portion overlaps with a region where the bank pattern is not provided and the electroluminescence device is provided, and the transmittance adjustment member comprises a first portion overlapping with the circuit portion and a second portion overlapping with the opening portion.

13. A display apparatus comprising:

a pixel area having red, green, blue and white pixels and having an opening portion and a circuit portion adjacent to the opening portion defined at a display panel; and an optical film disposed on a light emitting surface of the display panel and including a transmittance adjustment member having a first material as a matrix and a second material different from the first material dispersed in the first material, and the transmittance adjustment member has a first portion overlapping with the circuit portion and a second portion overlapping with the opening portion and a reflection reducing member being in direct contact with the first material and the second material of the transmittance adjustment member; and a wavelength conversion layer disposed between a light emitting device and the optical film except for the white pixel and converting white light into one of red, green and blue light, wherein the opening portion overlaps with the light emitting device and the wavelength conversion layer.

14. The display apparatus of claim 13, wherein the first material includes a transparent polymer material, and the second material includes a dye or a pigment having a transmittance of 40% or less with respect to each of a red wavelength, a green wavelength, and a blue wavelength.

15. The display apparatus of claim 13, wherein the second material is decomposed and uncolored by laser treatment using a laser having a wavelength between 390 nm to 450 nm, between 520 nm to 580 nm and between 670 nm to 730 nm.

16. The display apparatus of claim 13, wherein the second material is decomposed and uncolored by an ultraviolet treatment.

17. The display apparatus of claim 13, wherein the reflection reducing member is disposed more outward from the display panel than the transmittance adjustment member.

18. The display apparatus of claim 13, wherein the second portion of the transmittance adjustment member is provided in the opening portion of the pixel area.

19. The display apparatus of claim 13, wherein the second portion of the transmittance adjustment member is provided in a stripe structure corresponding to the opening portion of the pixel area.

* * * * *